(12) United States Patent
Tanaka et al.

(10) Patent No.: US 8,476,766 B2
(45) Date of Patent: Jul. 2, 2013

(54) SEMICONDUCTOR MEMORY DEVICE AND METHOD FOR MANUFACTURING THE SAME

(75) Inventors: Hiroyasu Tanaka, Mie-ken (JP); Megumi Ishiduki, Mie-ken (JP); Ryota Katsumata, Mie-ken (JP); Masaru Kidoh, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 13/045,819

(22) Filed: Mar. 11, 2011

(65) Prior Publication Data

US 2012/0068354 A1 Mar. 22, 2012

(30) Foreign Application Priority Data

Sep. 22, 2010 (JP) ................................. 2010-212649

(51) Int. Cl.
*H01L 23/48* (2006.01)
*H01L 23/52* (2006.01)
(52) U.S. Cl.
USPC .... 257/758; 257/752; 257/754; 257/E23.142; 257/774
(58) Field of Classification Search
USPC ........................... 257/758, 752, 754, E23.142
See application file for complete search history.

(56) References Cited

U.S. PATENT DOCUMENTS

| | | | | |
|---|---|---|---|---|
| 6,087,727 A * | 7/2000 | Tsutsumi | ........................ | 257/754 |
| 6,215,187 B1 * | 4/2001 | Ooto et al. | ..................... | 257/758 |
| 6,740,916 B1 * | 5/2004 | Ireland et al. | ................. | 257/296 |
| 6,870,215 B2 | 3/2005 | Endoh et al. | | |
| 7,615,848 B2 * | 11/2009 | Uchikoshi et al. | ............. | 257/620 |
| 2005/0285153 A1 * | 12/2005 | Weis et al. | ..................... | 257/232 |
| 2007/0057301 A1 * | 3/2007 | Wang et al. | .................... | 257/296 |
| 2007/0252201 A1 | 11/2007 | Kito et al. | | |
| 2008/0073711 A1 * | 3/2008 | Murata et al. | .................. | 257/334 |
| 2008/0191257 A1 * | 8/2008 | Temmler et al. | .............. | 257/300 |
| 2010/0207195 A1 | 8/2010 | Fukuzumi et al. | | |

FOREIGN PATENT DOCUMENTS

JP   2010-165794   7/2010

OTHER PUBLICATIONS

U.S. Appl. No. 13/419,984, filed Mar. 14, 2012, Sato et al.
U.S. Appl. No. 13/415,057, filed Mar. 8, 2012, Higuchi.
U.S. Appl. No. 13/236,723, filed Sep. 20, 2011, Ishiduki et al.
Office Action issued Feb. 1, 2013 in Japanese Application No. 2010-212649 filed Sep. 22, 2010 (w/English language translation).

* cited by examiner

*Primary Examiner* — Nitin Parekh
(74) *Attorney, Agent, or Firm* — Oblon, Spivak, McClelland, Maier & Neustadt, L.L.P.

(57) ABSTRACT

According to one embodiment, a semiconductor memory device includes a multilayer body, a second electrode film provided on the multilayer body, a second insulating film provided on the second electrode film, a semiconductor film, a memory film and a gate insulating film. At boundary between the inner surface of the second through hole and the inner surface of the third through hole, or on the inner surface of the second through hole, a step difference is formed so that an upper side from the step difference is thicker than a lower side from the step difference.

6 Claims, 16 Drawing Sheets

SEMICONDUCTOR MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2010-212649, filed on Sep. 22, 2010; the entire contents of which are incorporated herein by reference.

FIELD

Embodiments described herein relate generally to a semiconductor memory device and a method for manufacturing the same.

BACKGROUND

A collectively processed multilayer memory is proposed as a way to increase the capacity and reduce the cost of a semiconductor memory device. In a collectively processed multilayer memory, insulating films and electrode films are alternately stacked on a semiconductor substrate to form a multilayer body. Then, through holes are formed in the multilayer body by lithography. A block layer, a charge storage layer, and a tunnel layer are deposited in this order in the through hole. Furthermore, a silicon pillar is buried in the through hole. Thus, the multilayer memory is manufactured. In such a multilayer memory, a memory transistor is formed at the intersection of the electrode film and the silicon pillar and serves as a memory cell. Furthermore, a select gate electrode is provided on the multilayer body. This select gate electrode is penetrated by the silicon pillar to connect the upper end of the silicon pillar to an upper interconnection. Thus, a select transistor is formed between the select gate electrode and the silicon pillar. By controlling this select transistor, connection of the silicon pillar to the upper interconnection can be switched.

DETAILED DESCRIPTION

Figure 1:
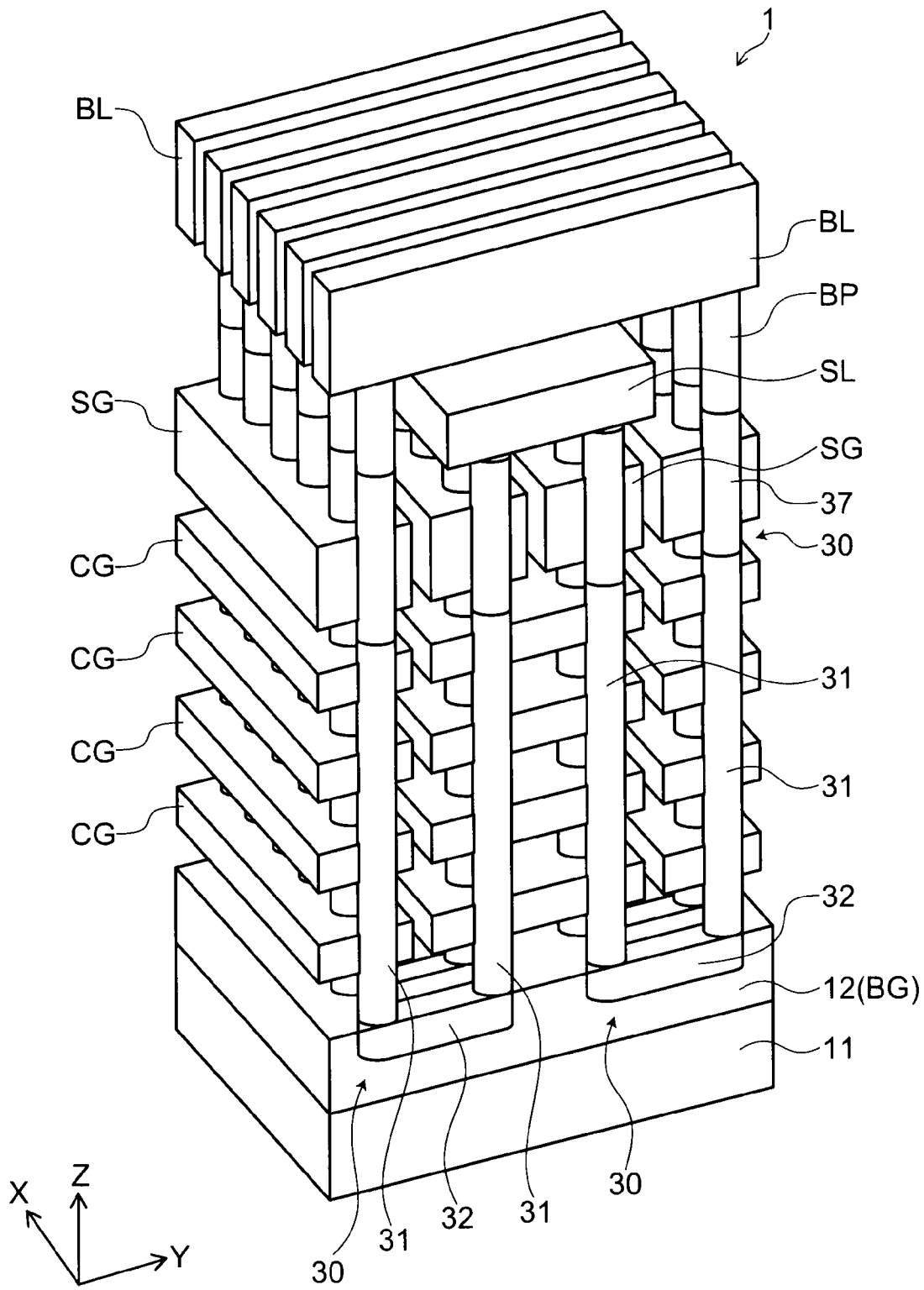
FIG. 1 is a perspective view illustrating a semiconductor memory device according to a first embodiment.

In general, according to one embodiment, a semiconductor memory device includes a multilayer body, a second electrode film, a second insulating film, a semiconductor film, a memory film and a gate insulating film. The multilayer body is provided with a plurality of first insulating films and first electrode films alternately stacked, and the multilayer body includes a first through hole extending in stacking direction of the first insulating films and the first electrode films. The second electrode film is provided on the multilayer body and includes a second through hole, and the second through hole extends in the stacking direction and is coupled with the first through hole. The second insulating film is provided on the second electrode film and includes a third through hole, and the third through hole extends in the stacking direction and is coupled with the second through hole. The semiconductor film is provided on an inner surface of the first to third through hole. The memory film is provided between the first electrode films and the semiconductor film. The gate insulating film is provided between the second electrode film and the semiconductor film. At boundary between the inner surface of the second through hole and the inner surface of the third through hole, a step difference is formed so that the third through hole is thicker than the second through hole.

In general, according to one embodiment, a semiconductor memory device includes a multilayer body, a second electrode film, a second insulating film, a semiconductor film, a memory film and a gate insulating film. The multilayer body is provided with a plurality of first insulating films and first electrode films alternately stacked, and the multilayer body includes a first through hole extending in stacking direction of the first insulating films and the first electrode films. The second electrode film is provided on the multilayer body and includes a second through hole, and the second through hole extends in the stacking direction and is coupled with the first through hole. The second insulating film is provided on the second electrode film and includes a third through hole, and the third through hole extends in the stacking direction and is coupled with the second through hole. The semiconductor film is provided on an inner surface of the first to third through hole. The memory film is provided between the first electrode films and the semiconductor film. The gate insulating film is provided between the second electrode film and the semiconductor film. On the inner surface of the second through hole, a step difference is formed so that an upper side of the second through hole is thicker than a lower side of the second through hole.

In general, according to one embodiment, a method for manufacturing a semiconductor memory device is disclosed. The method can include forming a multilayer body by alternately stacking a plurality of first insulating films and first electrode films. The method can include forming a first through hole in the multilayer body, the first through hole extending in stacking direction of the first insulating films and the first electrode films, forming a memory film on an inner surface of the first through hole, and forming a first semiconductor film on the memory film. The method can include forming a second electrode film on the multilayer body, forming a second insulating film on the second electrode film, and forming a third through hole extending in the stacking direction in the second insulating film. The method can include forming a spacer film on an inner surface of the third through hole, forming a second through hole extending in the stacking direction in the second electrode film by etching using the second insulating film and the spacer film as a mask, and removing the spacer film. In addition, the method can include forming a gate insulating film on an inner surface of the second through hole and the inner surface of the third through hole, forming a second semiconductor film on the gate insulating film, and implanting impurity into the second semiconductor film.

In general, according to one embodiment, a method for manufacturing a semiconductor memory device is disclosed. The method can include forming a multilayer body by alternately stacking a plurality of first insulating films and first electrode films. The method can include forming a first through hole in the multilayer body, the first through hole extending in stacking direction of the first insulating films and the first electrode films, forming a memory film on an inner surface of the first through hole, and forming a first semiconductor film on the memory film. The method can include forming a second electrode film on the multilayer body, forming a second insulating film on the second electrode film, and forming a third through hole extending in the stacking direction in the second insulating film. The method can include forming a second through hole extending in the stacking direction in the second electrode film by etching using the second insulating film as a mask, and expanding the third through hole. In addition, the method can include forming a gate insulating film on an inner surface of the second through hole and the third through hole, forming a second semiconductor film on the gate insulating film, and implanting impurity into the second semiconductor film.

In general, according to one embodiment, a method for manufacturing a semiconductor memory device is disclosed. The method can include forming a multilayer body by alternately stacking a plurality of first insulating films and first electrode films. The method can include forming a first through hole in the multilayer body, the first through hole extending in stacking direction of the first insulating films and the first electrode films, forming a memory film on an inner surface of the first through hole, and forming a first semiconductor film on the memory film. The method can include forming a second electrode film on the multilayer body, forming a second insulating film on the second electrode film, and forming a third through hole extending in the stacking direction in the second insulating film. The method can include forming a recess in an upper part of the second electrode film by etching using the second insulating film as a mask, and expanding the third through hole. The method can include forming a second through hole by etching using the second insulating film including the expanded third through hole as a mask, and the second through hole extends in the stacking direction and has an inner surface with a step difference formed so that an upper side of the second through hole is thicker than a lower side of the second through hole. In addition, the method can include forming a gate insulating film on the inner surface of the second through hole and an inner surface of the third through hole, forming a second semiconductor film on the gate insulating film, and implanting impurity into the second semiconductor film.

Embodiments of the invention will now be described with reference to the drawings.

First, a first embodiment is described.

FIG. 1 is a perspective view illustrating a semiconductor memory device according to this embodiment.

Figure 2:
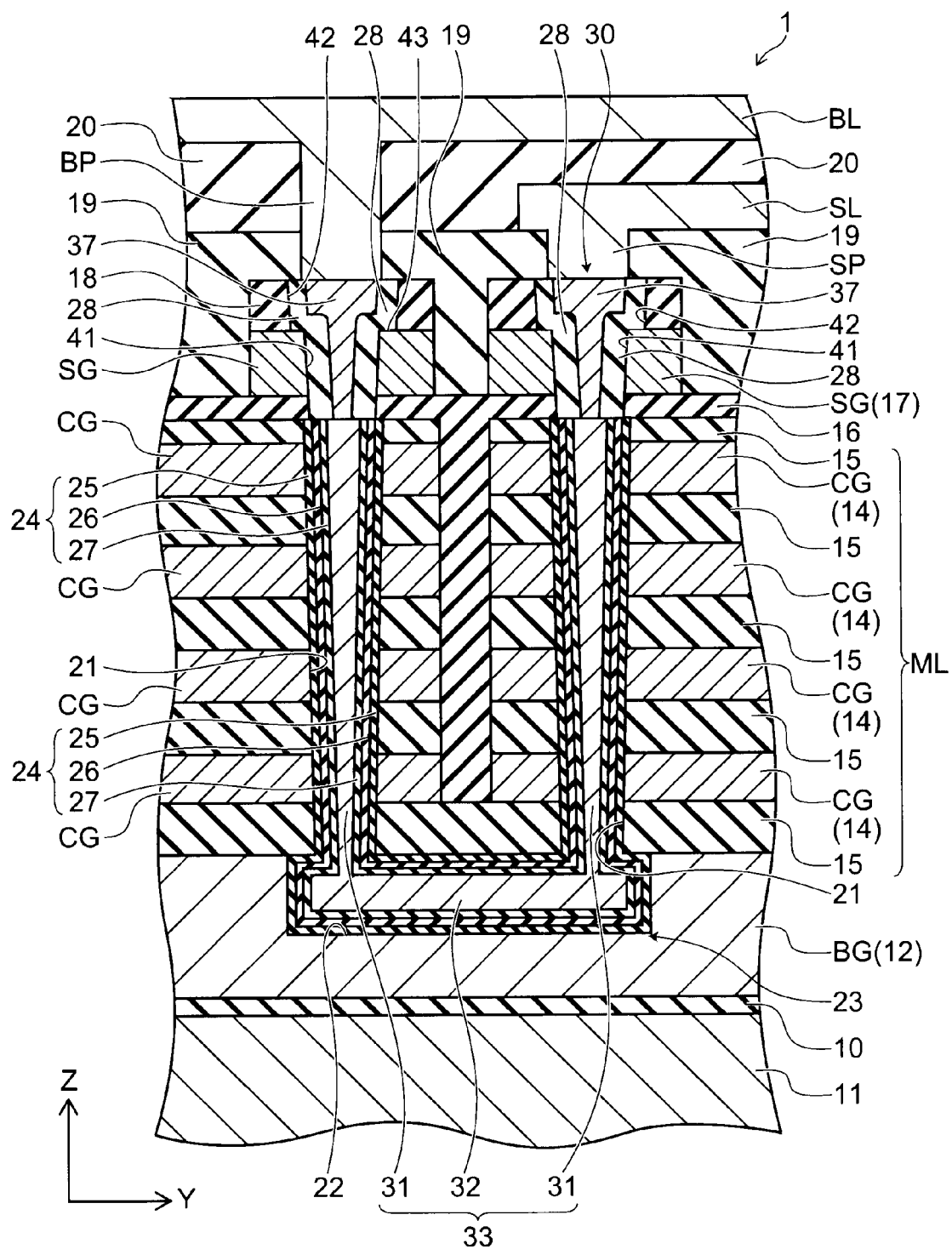
FIG. 2 is a sectional view illustrating the semiconductor memory device according to the first embodiment.

FIG. 2 is a sectional view illustrating the semiconductor memory device according to this embodiment.

Figure 3:
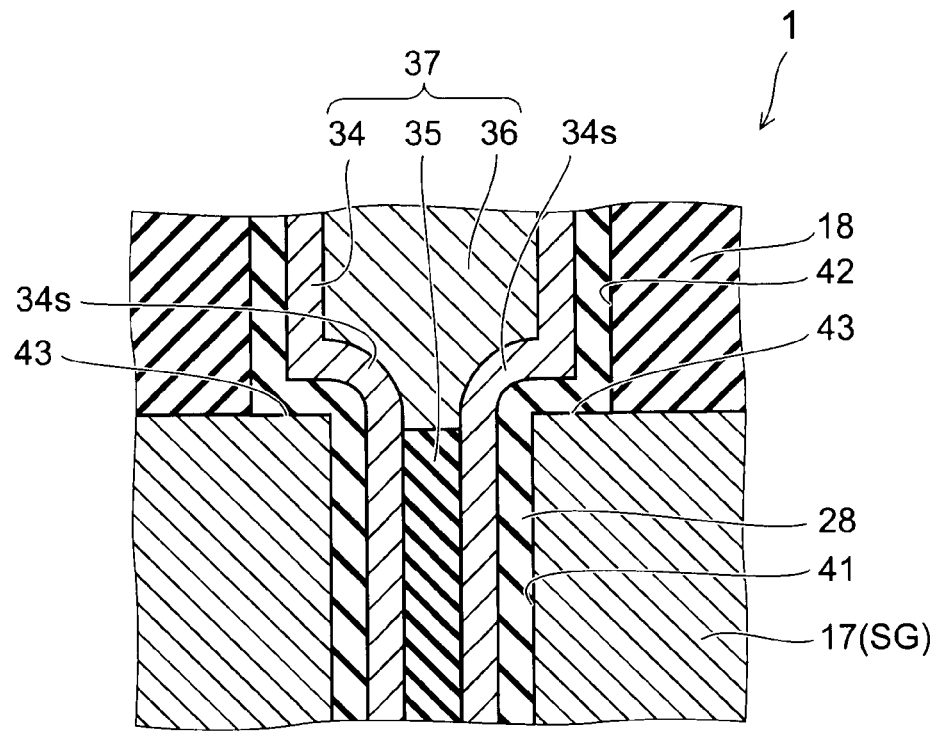
FIG. 3 is a sectional view illustrating the vicinity of the select gate electrode shown in FIG. 2.

FIG. 3 is a sectional view illustrating the vicinity of the select gate electrode shown in FIG. 2.

For clarity of illustration, FIG. 1 shows only the conductive portions, and the illustration of the insulating portions is omitted.

The semiconductor memory device according to this embodiment is a multilayer nonvolatile memory device.

As shown in FIGS. 1 and 2, in the semiconductor memory device 1 according to this embodiment, an insulating film 10 is provided on a silicon substrate 11. A conductive film, such as a polysilicon film 12, is formed on the insulating film 10 and serves as a back gate BG. On the back gate BG, a plurality of electrode films 14 (first electrode films) and insulating films 15 (first insulating films) are alternately stacked to constitute a multilayer body ML.

In the following, for convenience of description, an XYZ orthogonal coordinate system is herein introduced. In this coordinate system, the two directions parallel to the upper surface of the silicon substrate 11 and orthogonal to each other are referred to as X and Y direction, and the direction orthogonal to both the X and Y direction, i.e., the stacking direction of the electrode films 14 and insulating films 15, is referred to as Z direction.

The electrode film 14 is formed from e.g. polysilicon. The electrode film 14 is divided along the Y direction into a plurality of control gate electrodes CG extending in the X direction. As viewed from above in the Z direction, the electrode films 14 in the respective layers are patterned in the same pattern. On the other hand, the insulating film 15 is made of e.g. silicon oxide ($SiO_2$) and functions as an interlayer insulating film for insulating the electrode films 14 from each other.

On the multilayer body ML, an insulating film 16, an electrode film 17 (second electrode film), and an insulating film 18 (second insulating film) are formed in this order. The electrode film 17 is made of e.g. polysilicon, and divided along the Y direction into a plurality of select gate electrodes SG extending in the X direction. Two select gate electrodes SG are provided immediately above each uppermost control gate electrode CG.

An insulating film 19 is provided on the insulating film 18. Source lines SL extending in the X direction are provided on the insulating film 19. The source line SL is located immediately above every other control gate electrode CG of the uppermost control gate electrodes CG arranged along the Y direction. On the insulating film 19, an insulating film 20 is provided so as to cover the source line SL. A plurality of bit lines BL extending in the Y direction are provided on the insulating film 20. The source line SL and the bit line BL are each formed from a metal film.

A plurality of through holes 21 (first through holes) extending in the stacking direction (Z direction) of the layers are formed through the multilayer body ML. As viewed in the Z direction, the through hole 21 has e.g. a circular shape, and is narrowed downward, for instance. Each through hole 21 penetrates through the control gate electrode CG of each stage, and the lower end of the through hole 21 reaches the back gate BG. The through holes 21 are arranged in a matrix along the X and Y direction. Two through holes 21 arranged in the Y direction are paired. The through holes 21 belonging to the same pair penetrate through the same control gate electrode CG.

In the upper portion of the back gate BG, a communication hole 22 is formed so that the lower end portion of one through hole 21 is allowed to couple with the lower end portion of another through hole 21 spaced by one row in the Y direction as viewed from the former through hole 21. Thus, one continuous U-shaped hole 23 is formed from a pair of through holes 21 adjacent in the Y direction and the communication hole 22 allowing them to couple with each other. A plurality of U-shaped holes 23 are formed in the multilayer body ML.

A memory film 24 is provided on the inner surface of the U-shaped hole 23. In the memory film 24, sequentially from outside, an insulative block layer 25, a charge storage layer 26, and an insulative tunnel layer 27 are stacked. The block layer 25 is a layer which passes no substantial current even if a voltage is applied within the driving voltage range of the device 1. The block layer 25 is formed from e.g. silicon oxide. The charge storage layer 26 is a layer capable of trapping charge. The charge storage layer 26 is formed from e.g. silicon nitride. The tunnel layer 27 is a layer which is normally insulative, but passes a tunneling current when a prescribed voltage within the driving voltage range of the device 1 is applied. The tunnel layer 27 is formed from e.g. silicon oxide. That is, the film configuration, i.e., the lamination of layers, of the memory film 24 is e.g. an ONO (oxide nitride oxide) configuration.

On the inner surface of the U-shaped hole 23, a silicon film (semiconductor film) made of a semiconductor material, such as polysilicon, doped with impurity is formed. Thus, a hollow U-shaped silicon member 33 is provided inside the U-shaped hole 23. In the U-shaped silicon member 33, the portion located in the through hole 21 constitutes a silicon pillar 31, and the portion located in the communication hole 22 constitutes a connecting member 32. The silicon pillar 31 is shaped like a circular cylinder extending in the Z direction. The connecting member 32 is shaped like a rectangular cylinder extending in the Y direction. The inside of the U-shaped silicon member 33 is filled with e.g. silicon nitride (not shown). However, the U-shaped silicon member 33 may be filled with polysilicon to its center. Two silicon pillars 31 and one connecting member 32 constituting the U-shaped silicon member 33 are integrally formed. Hence, the U-shaped silicon member 33 is formed seamlessly and continuously along its longitudinal direction. Furthermore, the memory film 24 is located between the U-shaped silicon member 33 on one hand and the back gate BG and the control gate electrode CG on the other. Hence, the U-shaped silicon member 33 is insulated from the back gate BG and the control gate electrode CG by the memory film 24.

Furthermore, a plurality of through holes 41 (second through holes) extending in the Z direction are formed in the insulating film 16 and the select gate electrode SG. Each through hole 41 is formed immediately above the corresponding through hole 21, and couples with the through hole 21. Furthermore, through holes 42 (third through holes) extending in the Z direction are formed in the insulating film 18. Each through hole 42 is formed immediately above the corresponding through hole 41, and couples with the through hole 41. The detailed shape of the through holes 41 and 42 is described later.

As shown in FIGS. 2 and 3, a gate insulating film 28 is formed on the inner surface of the through holes 41 and 42. Furthermore, a silicon film 34 (semiconductor film) made of polysilicon doped with impurity is formed on the gate insulating film 28. The silicon film 34 is insulated from the select gate electrode SG by the gate insulating film 28. In the lower part of the space surrounded by the silicon film 34, such as in the through hole 41, a silicon nitride member 35 is provided. In the upper part of this space, such as in the through hole 42, a silicon member 36 made of conductive polysilicon doped with impurity such as phosphorus is buried. The silicon film 34, the silicon nitride member 35, and the silicon member 36 form a silicon pillar 37 extending in the Z direction. The gate insulating film 28 is located between the electrode film 17 (select gate electrode SG) and the silicon pillar 37. The lower end portion of the silicon pillar 37 is connected to the upper end portion of the silicon pillar 31 formed therebelow. The U-shaped silicon member 33 and a pair of silicon pillars 37 connected to the upper end portion of the U-shaped silicon member 33 constitute a U-shaped pillar 30.

Of a pair of silicon pillars 37 belonging to each U-shaped pillar 30, one silicon pillar is connected to the source line SL through a source plug SP buried in the insulating film 19, and the other silicon pillar is connected to the bit line BL through a bit plug BP buried in the insulating films 19 and 20. Hence, the U-shaped pillar 30 is connected between the bit line BL and the source line SL. The arrangement pitch in the Y direction of the U-shaped pillars 30 is equal to that of the control gate electrodes CG. However, the phase is shifted by half the pitch. Hence, a pair of silicon pillars 31 belonging to each U-shaped pillar 30, i.e., the two silicon pillars 31 connected to each other by the connecting member 32, penetrate through different control gate electrodes CG.

In the device 1, the silicon pillar 31 functions as a channel, and the control gate electrode CG functions as a gate electrode. Thus, a vertical memory transistor is formed at the intersection of the silicon pillar 31 and the control gate electrode CG. Each memory transistor functions as a memory cell by storing electrons in the charge storage layer 26 located between the silicon pillar 31 and the control gate electrode CG. In the multilayer body ML, a plurality of silicon pillars 31 are arranged in a matrix along the X and Y direction. Hence, a plurality of memory transistors are arranged three-dimensionally along the X, Y, and Z direction.

Furthermore, at the intersection of the silicon pillar 37 and the select gate electrode SG, a select transistor is formed with the silicon film 34 serving as a channel, the select gate electrode SG as a gate electrode, and the gate insulating film 28 as a gate insulating film. Like the aforementioned memory transistor, this select transistor is also a vertical transistor.

Furthermore, the memory film 24 is interposed between the connecting member 32 and the back gate BG. Hence, a back gate transistor is formed with the connecting member 32 serving as a channel, the back gate BG as a gate electrode, and the memory film 24 as a gate insulating film. That is, the back gate BG functions as an electrode for controlling the conduction state of the connecting member 32 by electric field.

As shown in FIG. 3, at the boundary between the inner surface of the through hole 41 and the inner surface of the through hole 42, a step difference 43 is formed so that its upper side is thicker than its lower side. Thus, the through hole 42 is thicker than the through hole 41 across the step difference 43. Furthermore, the portion 34s of the silicon film 34 covering the step difference 43 has higher impurity concentration than the portion of the silicon film 34 except the portion 34s.

Next, a method for manufacturing a semiconductor memory device according to this embodiment is described.

FIGS. 4 to 11 are process sectional views illustrating the method for manufacturing a semiconductor memory device according to this embodiment.

FIGS. 12A to 12C, 13A to 13C, 14A to 14C are process sectional views illustrating the method for manufacturing a semiconductor memory device according to this embodiment, and showing the vicinity of the select gate electrode.

Here, FIGS. 4 to 11 show the same cross section as FIG. 2. FIGS. 12A to 14C show the same cross section as FIG. 3.

Figure 4:
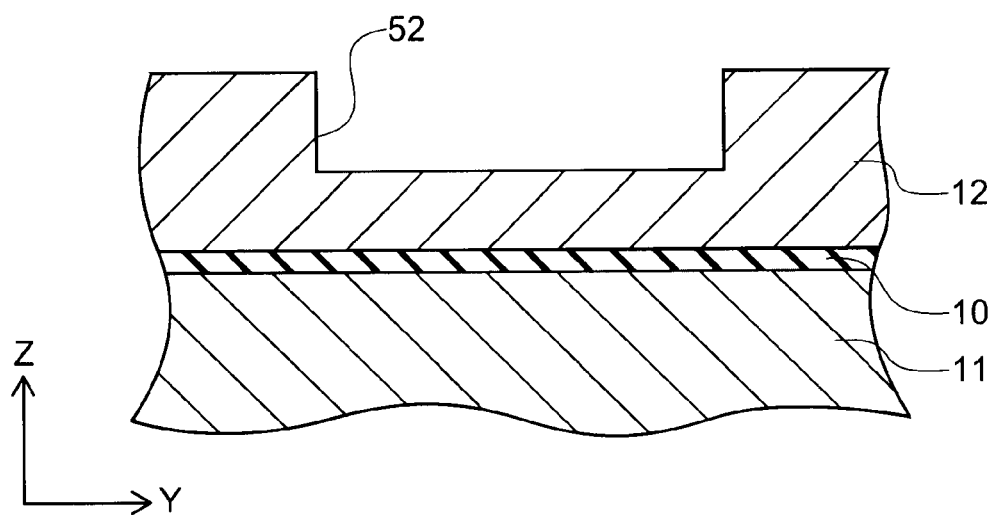
FIGS. 4 to 11 are process sectional views illustrating a method for manufacturing the semiconductor memory device according to the first embodiment.

First, as shown in FIG. 4, a silicon substrate 11 is prepared. Then, an insulating film 10 is formed on the silicon substrate 11, and a polysilicon film 12 is deposited on the insulating film 10. Then, photolithography and RIE (reactive ion etching) are performed on the upper portion of the polysilicon film 12. Thus, a plurality of strip-like trenches 52 extending in the Y direction are formed in the upper surface of the polysilicon film 12. The trenches 52 are arranged in a matrix along the X and Y direction.

Figure 5:
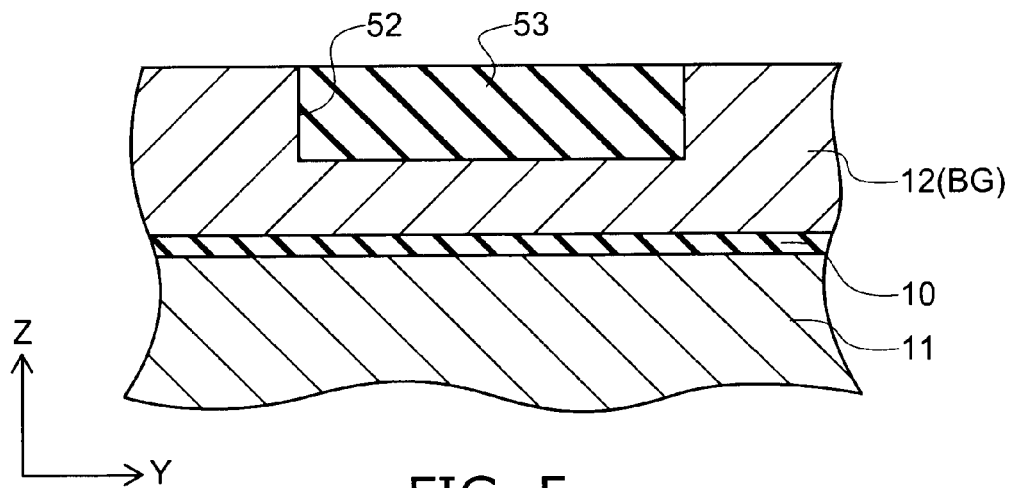

Next, as shown in FIG. 5, a silicon nitride film is deposited by e.g. the CVD (chemical vapor deposition) method. Thus, a sacrificial film 53 is buried in the trench 52 of the polysilicon film 12. Next, the polysilicon film 12 is processed by e.g. photolithography and RIE to form a back gate BG.

Figure 6:
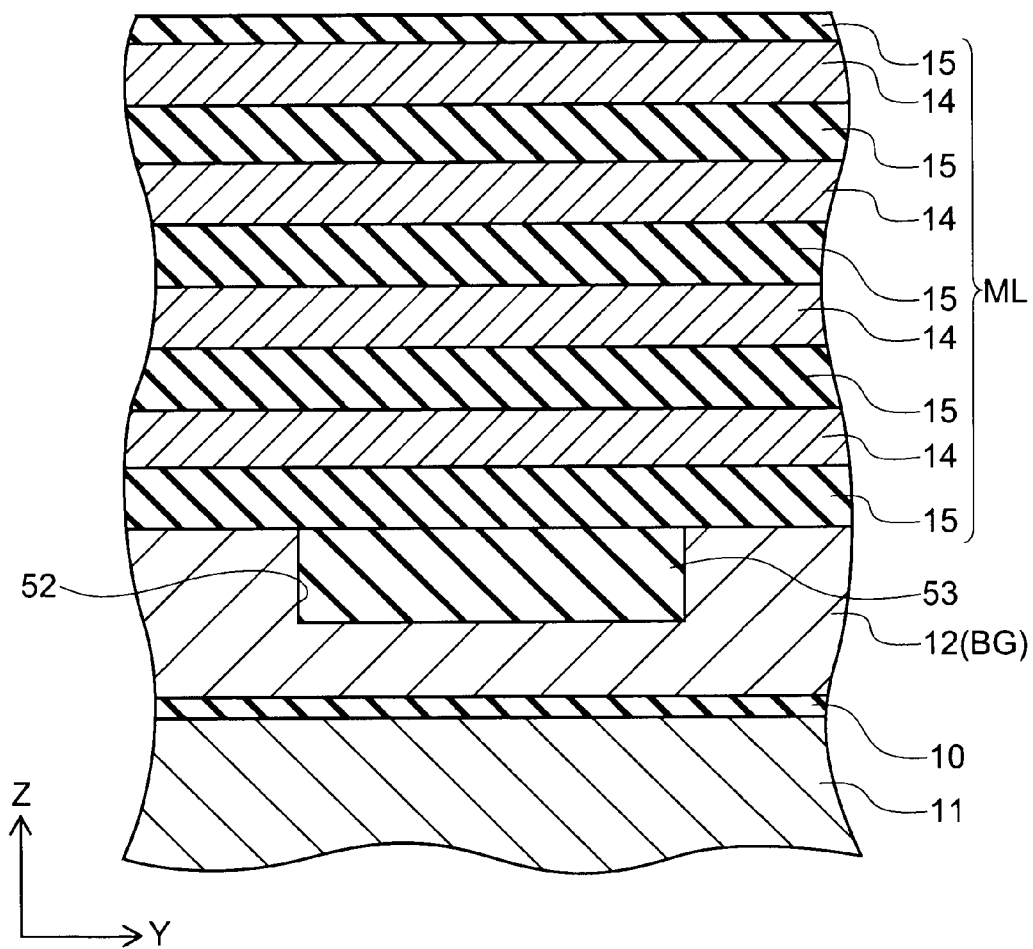

Next, as shown in FIG. 6, on the back gate BG (polysilicon film 12), insulating films 15 made of e.g. silicon oxide and electrode films 14 made of e.g. polysilicon are alternately deposited to form a multilayer body ML.

Figure 7:
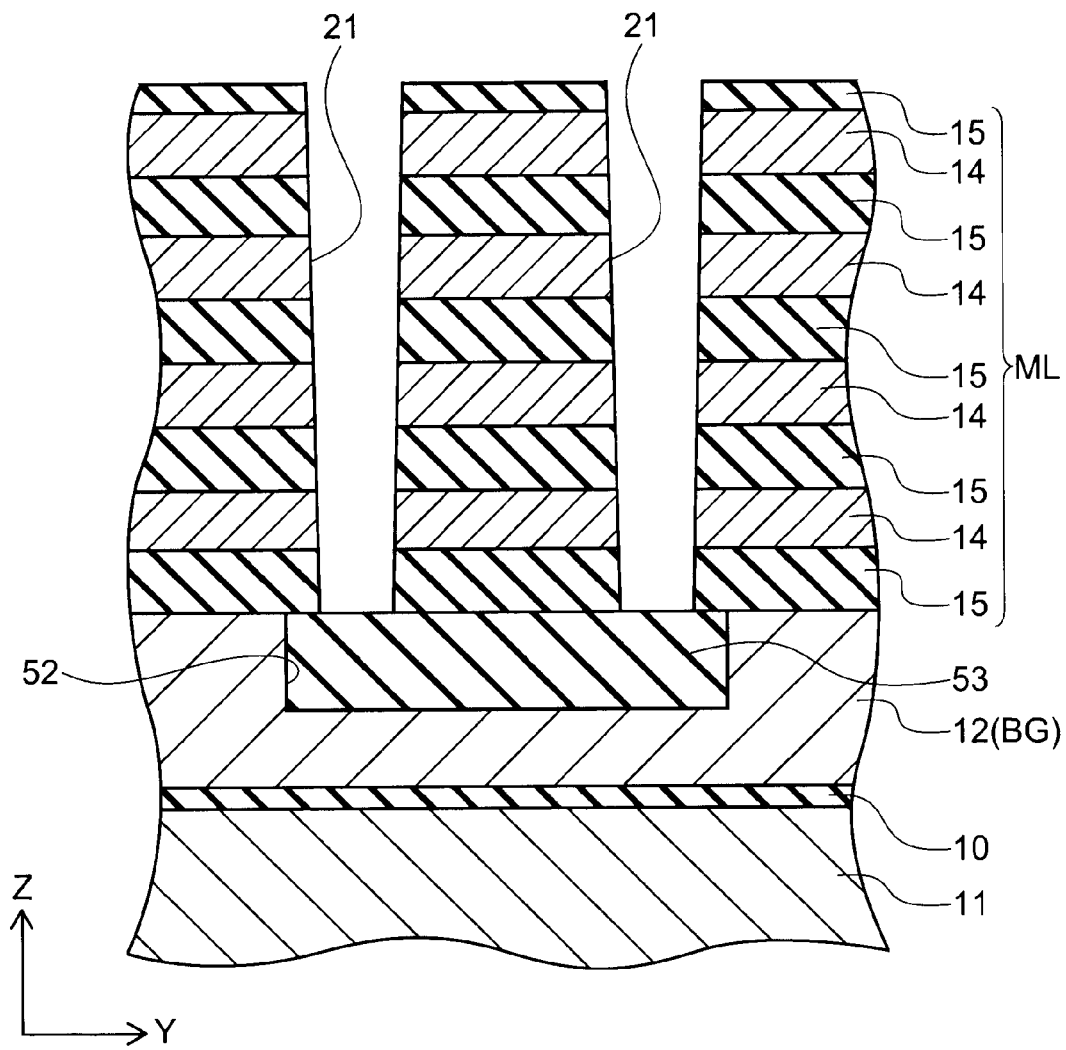

Next, as shown in FIG. 7, by e.g. RIE, a plurality of through holes 21 extending in the Z direction are collectively formed in the multilayer body ML. The through holes 21 are arranged in a matrix along the X and Y direction. The bottom of the through hole 21 is caused to reach both end portions of the sacrificial film 53 buried in the trench 52.

Figure 8:
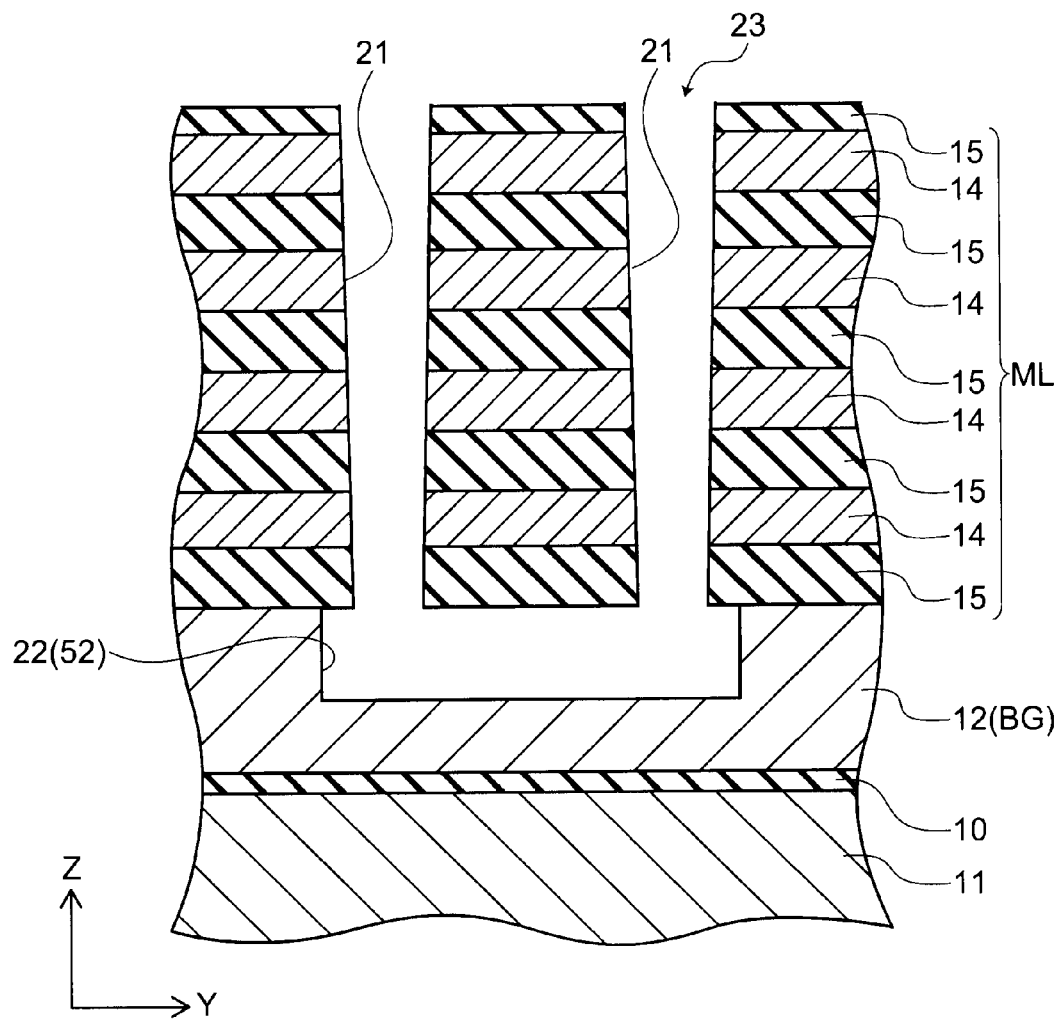

Next, as shown in FIG. 8, wet etching is performed through the through hole 21 to remove the sacrificial film 53 (see FIG. 7) in the trench 52. Thus, the trench 52 constitutes a communication hole 22. One continuous U-shaped hole 23 is formed from the communication hole 22 and two through holes 21 coupled with both end portions of the communication hole 22.

Figure 9:
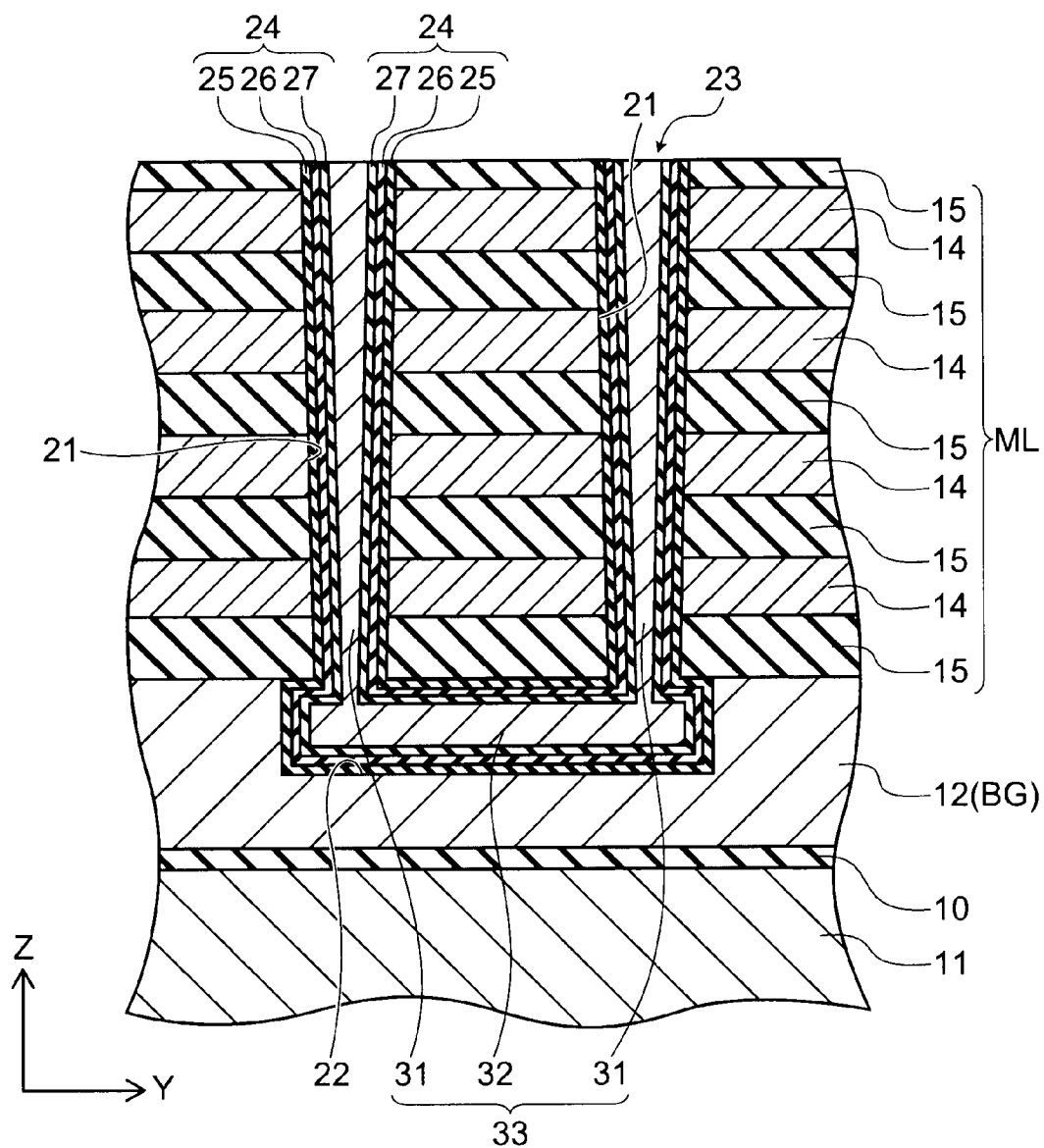

Next, as shown in FIG. 9, silicon oxide, silicon nitride, and silicon oxide are continuously deposited. Thus, on the inner surface of the U-shaped hole 23, a block layer 25 made of silicon oxide, a charge storage layer 26 made of silicon nitride, and a tunnel layer 27 made of silicon oxide are stacked in this order to form a memory film 24.

Next, amorphous silicon is deposited on the entire surface. Thus, a silicon film is formed on the inner surface of the U-shaped hole 23 to form a U-shaped silicon member 33 having a hollow structure. The U-shaped silicon member 33 is composed of a pair of silicon pillars 31 buried in the through hole 21 and one connecting member 32 buried in the communication hole 22. Next, silicon nitride (not shown) is deposited and buried inside the U-shaped silicon member 33. Subsequently, the silicon nitride, amorphous silicon, silicon oxide, silicon nitride, and silicon oxide deposited on the multilayer body ML are removed.

Figure 10:
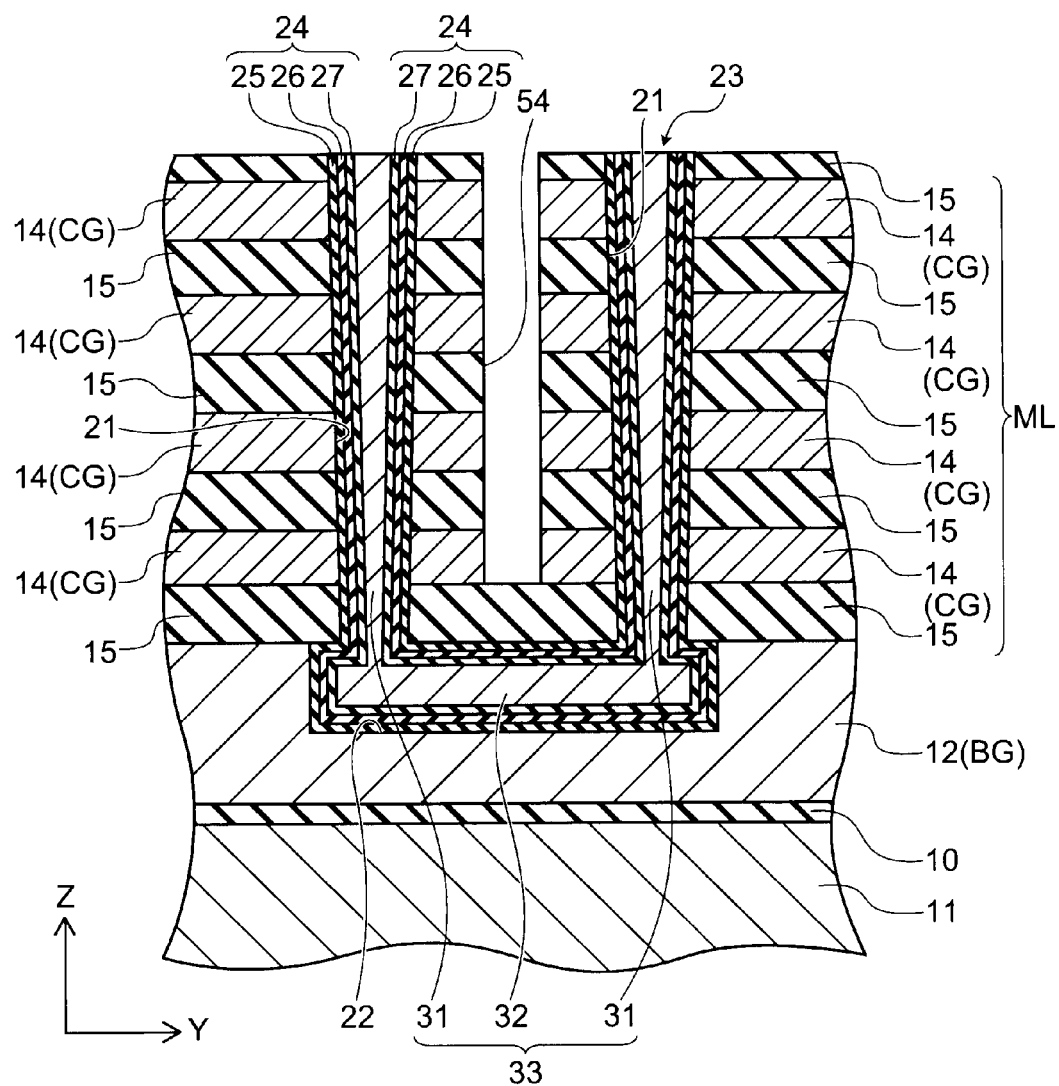

Next, as shown in FIG. 10, the multilayer body ML is processed by e.g. RIE to form a trench 54 in the multilayer body ML. The trench 54 extends in the X direction so as to connect the regions between two silicon pillars 31 connected to the connecting member 32 and reach the lowermost insulating film 15. Thus, the electrode film 14 is divided into a plurality of control gate electrodes CG extending in the X direction.

Figure 11:
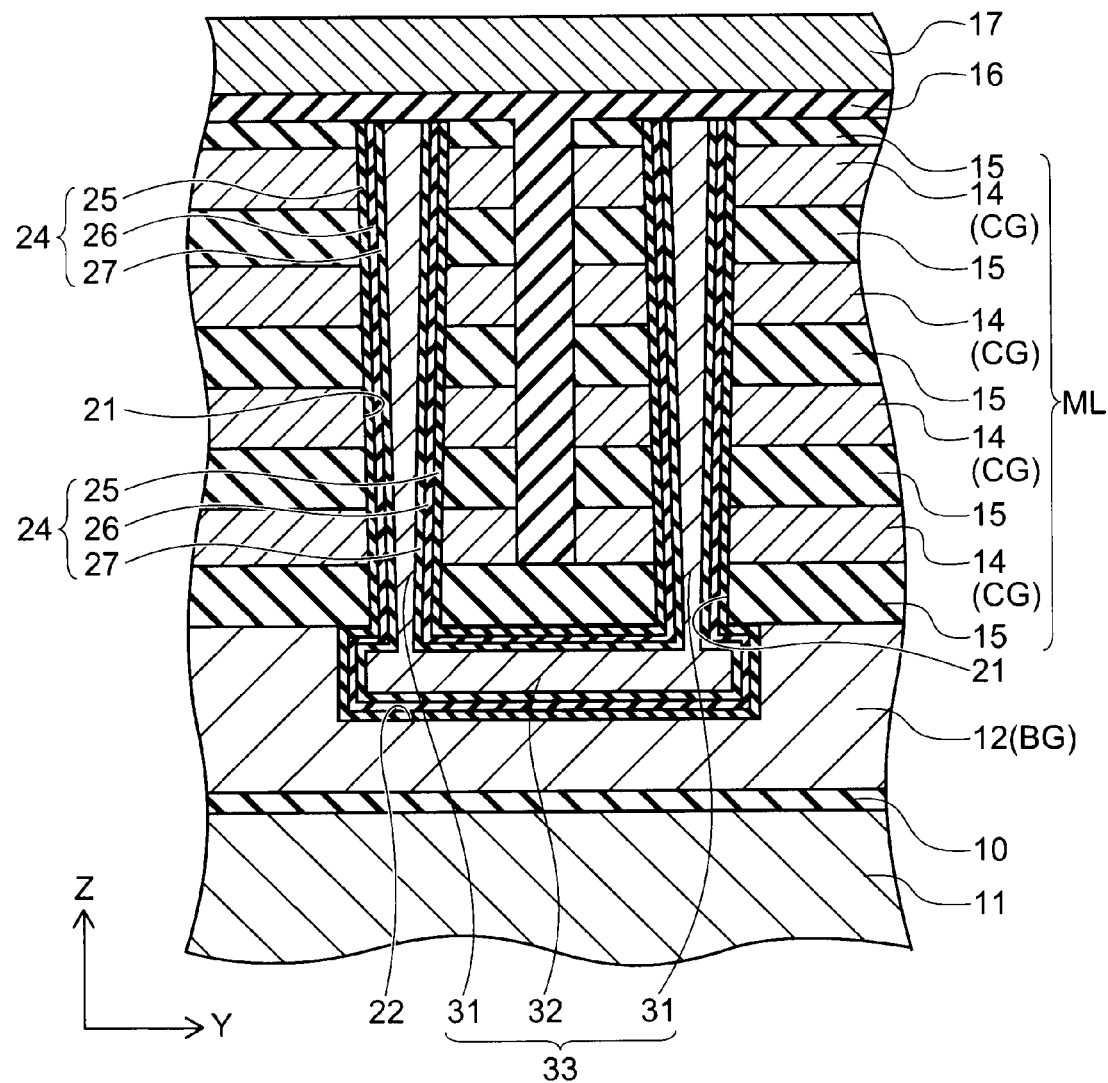

Next, as shown in FIG. 11, an insulating film 16 is deposited on the multilayer body ML and planarized. The insulating film 16 is also buried in the trench 54. Next, an electrode film 17 made of e.g. amorphous silicon is deposited.

Figure 12A:
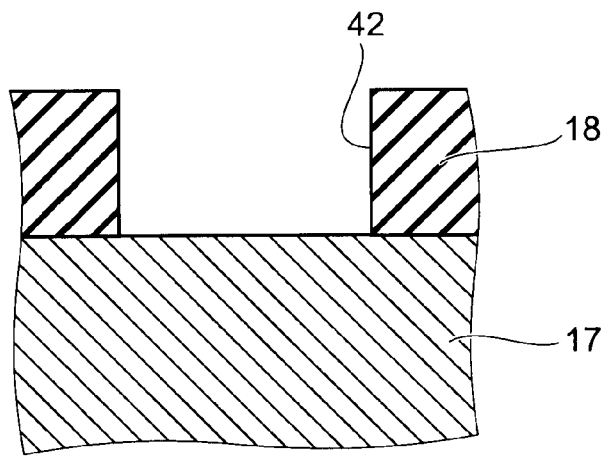
FIGS. 12A to 14C are process sectional views illustrating the method for manufacturing the semiconductor memory device according to the first embodiment, and showing the vicinity of the select gate electrode.
Figure 12B:
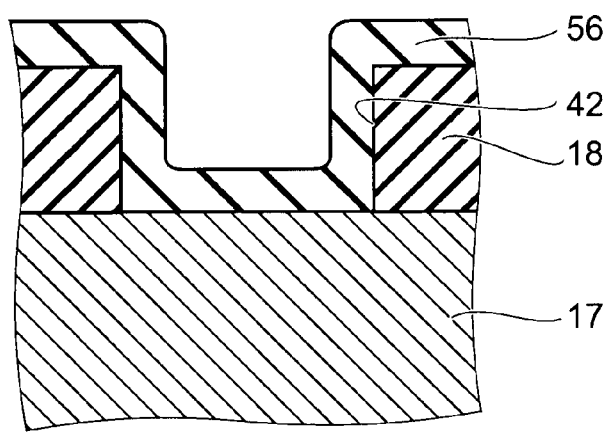
Figure 12C:
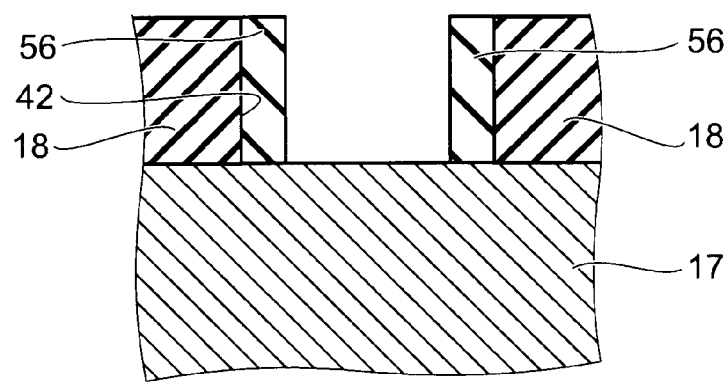

Next, as shown in FIG. 12A, non-doped silicon oxide is deposited by the CVD method to form an insulating film 18 on the electrode film 17. Next, by RIE, a through hole 42 extending in the Z direction is formed in the insulating film 18. Here, the through hole 42 is caused to reach the electrode film 17, but no through hole is formed in the electrode film 17. Next, as shown in FIG. 12B, silicon oxide doped with boron is deposited by the CVD method to form a spacer film 56 made of BSG (boron silicate glass, or boron-doped silicon oxide). Next, as shown in FIG. 12C, the spacer film 56 is etched back and left only on the inner surface of the through hole 42.

Figure 13A:
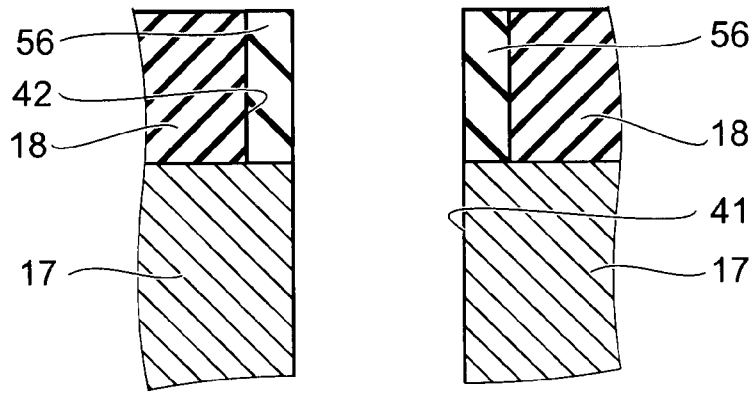

Next, as shown in FIG. 13A, the insulating film 18 and the spacer film 56 are used as a mask to perform etching such as RIE so that a through hole 41 extending in the Z direction is formed in the electrode film 17. Here, because the spacer film 56 is provided on the inner surface of the through hole 42, the diameter of the through hole 41 is made smaller by the amount of the film thickness of the spacer film 56 than the diameter of the through hole 42.

Figure 13B:
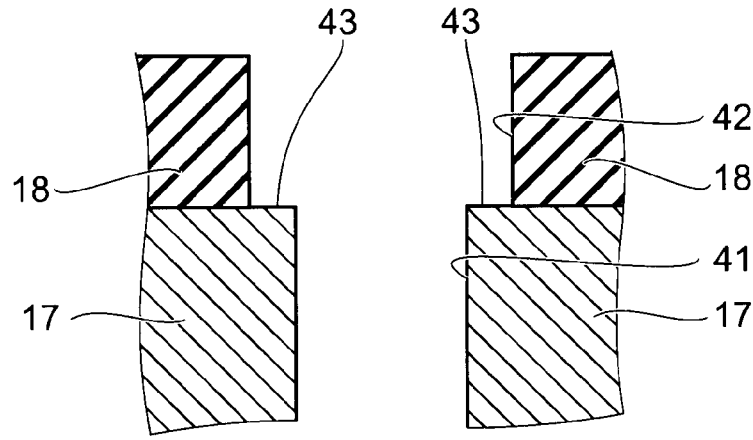
Figure 13C:
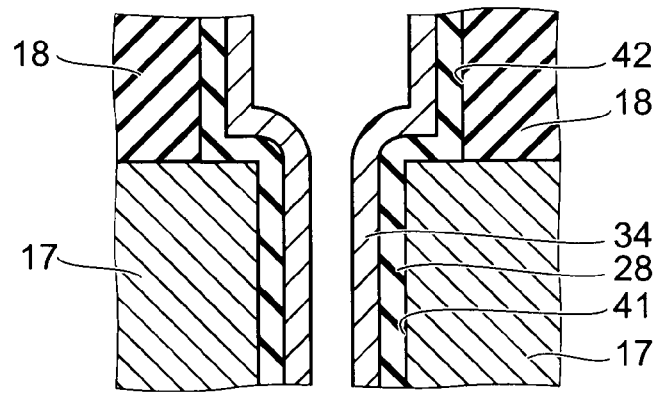

Next, as shown in FIG. 13B, for instance, hydrogen fluoride (HF) solution is used to perform vapor phase cleaning to remove the spacer film 56 made of BSG. Thus, a step difference 43 is formed at the boundary between the inner surface of the through hole 41 and the inner surface of the through hole 42. Next, as shown in FIG. 13C, silicon oxide, for instance, is deposited to form a gate insulating film 28 on the inner surface of the through holes 41 and 42. Next, polysilicon is deposited by e.g. the CVD method to form a silicon film 34 on the gate insulating film 28. The gate insulating film 28 and the silicon film 34 are not buried to the center of the through holes 41 and 42. Here, the shape of the gate insulating film 28 and the silicon film 34 reflects the step difference 43. In the portion 34s of the silicon film 34 covering the step difference 43, the upper surface is greatly inclined from the Z direction and faces upward.

Figure 14A:
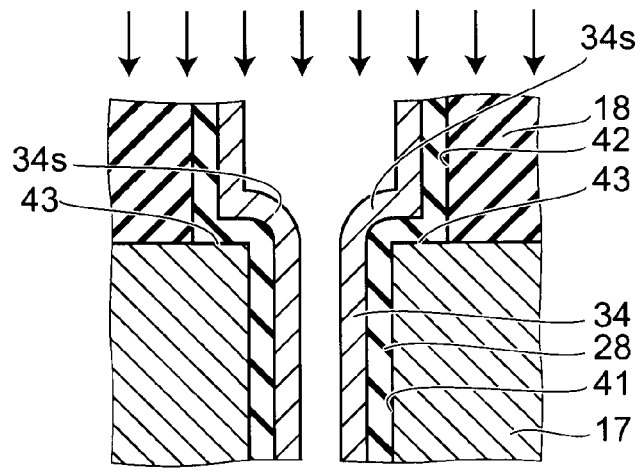

Next, as shown in FIG. 14A, a first round of impurity ion implantation is performed on the silicon film 34. This ion implantation is performed in the vertical direction (Z direction) with a dose amount of e.g. $5 \times 10^{14}$ cm$^{-2}$ and an acceleration voltage of e.g. 20-30 keV. Here, in the portion 34s of the silicon film 34 covering the step difference 43, the implantation angle of impurity ions is larger than in the other portion, and hence the implantation efficiency of impurity ions is higher. In contrast, in the portion of the silicon film 34 except the portion 34s, the implantation angle of impurity ions is nearly 0°, and hence the implantation efficiency of impurity ions is low.

Figure 14B:
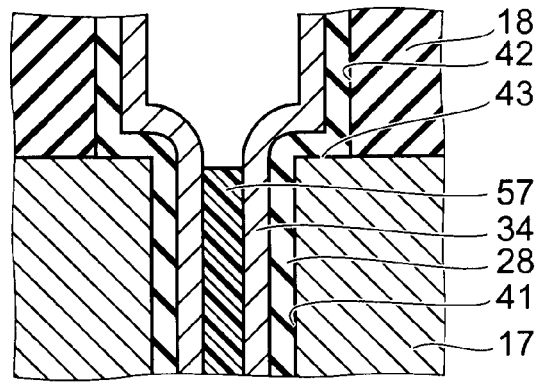
Figure 14C:
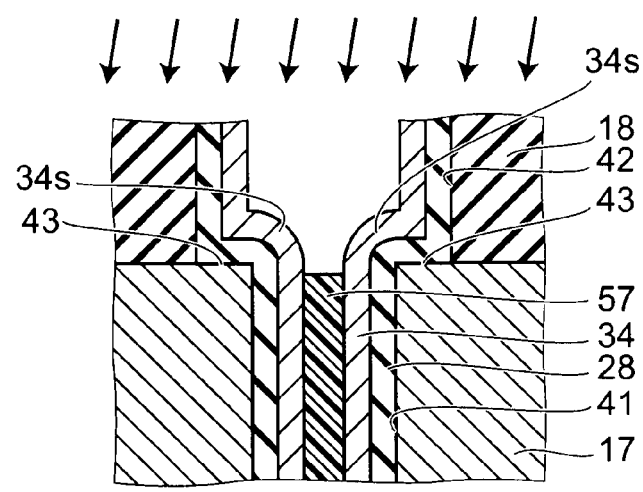

Next, as shown in FIG. 14B, a resist material is applied and recessed. Thus, the resist material 57 is buried only in the through hole 41. Next, as shown in FIG. 14C, a second round of impurity ion implantation is performed on the silicon film 34. This ion implantation is performed in the direction of e.g. 5° inclined from the Z direction. The dose amount is e.g. $1 \times 10^{14}$ cm$^{-2}$, and the acceleration voltage is e.g. 20-30 keV. This second round of ion implantation is performed four times in different implantation directions. The implantation directions are configured to be fourfold symmetric about the Z direction. Also in this case, as in the first round of ion implantation, in the portion 34s of the silicon film 34 covering the step difference 43, the implantation angle of impurity ions is larger than in the other portion, and hence the implantation efficiency of impurity ions is higher. In contrast, in the portion of the silicon film 34 formed in the through hole 42 except the portion 34s, the implantation angle of impurity ions is approximately 5°, and hence the implantation efficiency of impurity ions is low. Furthermore, in the portion of the silicon film 34 formed in the through hole 41, implantation of impurity ions is blocked by the resist material 57.

Next, as shown in FIG. 3, the resist material 57 (see FIGS. 14A to 14C) is removed. Next, silicon nitride is deposited by the CVD method and buried in the through holes 41 and 42. Next, this silicon nitride is etched back so that its upper surface is set back to a desired height. For instance, this silicon nitride is removed from inside the through hole 42 and left only in the through hole 41. Thus, a silicon nitride member 35 is buried in the space surrounded by the silicon film 34 in the through hole 41. Next, polysilicon doped with e.g. phosphorus is deposited and etched back to bury a silicon member 36 in the space surrounded by the silicon film 34 in the through hole 42. A silicon pillar 37 is formed from the silicon film 34, the silicon nitride member 35, and the silicon member 36. Here, during deposition of the silicon member 36 and in a subsequent thermal process, the impurity such as phosphorus contained in the silicon member 36 diffuses into the silicon film 34.

Next, as shown in FIG. 2, the insulating film 18 and the electrode film 17 are processed by e.g. RIE. Thus, the electrode film 17 is divided along the Y direction into a plurality of select gate electrodes SG extending in the X direction. Next, an insulating film 19 is formed on the insulating film 18. Source plugs SP are buried in the insulating film 19, and source lines SL extending in the X direction are formed on the insulating film 19. Here, the source lines SL are connected to some silicon pillars 37 through the source plugs SP. Next, an insulating film 20 is formed on the insulating film 19 so as to cover the source line SL. Next, bit plugs BP are buried in the insulating films 20 and 19, and bit lines BL extending in the Y direction are formed on the insulating film 20. Here, the bit lines BL are connected to the remaining silicon pillars 37 through the bit plugs BP. Thus, the semiconductor memory device 1 is manufactured.

Next, the operation and effect of this embodiment are described.

In this embodiment, in the process shown in FIG. 13B, a step difference 43 is formed at the boundary between the inner surface of the through hole 41 and the inner surface of the through hole 42. Thus, in the process shown in FIG. 13C, when the silicon film 34 is formed, the shape of the silicon film 34 reflects the step difference 43, and the upper surface of the portion 34s covering the step difference 43 faces upward. Hence, in the ion implantation processes shown in FIGS. 14A and 14C, the efficiency of impurity implantation into the portion 34s of the silicon film 34 increases. This increases the impurity concentration in the portion 34s of the silicon film 34.

In the semiconductor memory device 1, in erasing data from a memory cell, the control gate electrode is applied with e.g. the ground potential, and the bit line BL is applied with a positive potential. Thus, a depletion layer is formed in the silicon film 34 and applied with an electric field. Hence, electron-hole pairs are generated, and holes of these pairs are injected into the silicon pillar 31. That is, GIDL (gate induced drain leakage) is caused to occur. Thus, the potential of the silicon pillar 31 relative to the control gate electrode CG is increased so that holes are injected from the silicon pillar 31 through the tunnel layer 27 into the charge storage layer 26. These holes undergo pair annihilation with electrons stored in the charge storage layer 26, and thus the data is erased. Furthermore, in this embodiment, the impurity concentration in the portion 34s of the silicon film 34 located near the select gate electrode SG is increased. Hence, even if the voltage applied between the control gate electrode CG and the bit line BL is left unchanged, the depletion layer formed in the silicon film 34 is narrowed, and a higher electric field can be formed in the depletion layer. Consequently, the above erase operation can be realized at a lower voltage. Thus, the semiconductor memory device 1 according to this embodiment has lower power consumption.

Furthermore, in this embodiment, a step difference 43 is formed at the boundary between the inner surface of the through hole 41 and the inner surface of the through hole 42, and then impurity is ion-implanted into the silicon film 34. Hence, the portion 34s of the silicon film 34 covering the step difference 43 can be reliably doped with impurity. Thus, the impurity concentration in the portion of the silicon film 34 located near the select gate electrode SG is reliably increased, and the above effect can be reliably achieved.

Furthermore, in this embodiment, the upper portion of the silicon pillar 37 is thickened. Hence, the resistance between the silicon pillar 31 and the source line SL or the bit line BL can be reduced. This also serves to reduce the power consumption of the semiconductor memory device 1.

In this embodiment, the process of performing ion implantation in the vertical direction shown in FIG. 14A and the process of burying the resist material 57 and performing ion implantation in the oblique direction shown in FIGS. 14B and 14C may be performed in the reverse order. Furthermore, the step difference 43 may be formed by other methods. Furthermore, the film configuration of the gate insulating film 28 may be the same as the film configuration of the memory film 24.

Next, a second embodiment is described.

Figure 15A:
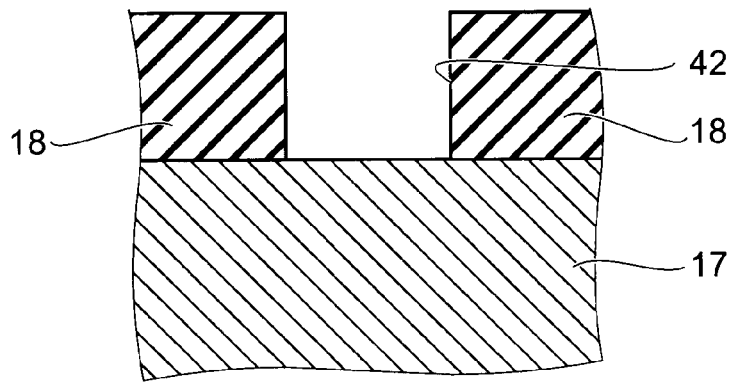
FIGS. 15A to 15C are process sectional views illustrating a method for manufacturing a semiconductor memory device according to a second embodiment, and showing the vicinity of the select gate electrode.
Figure 15B:
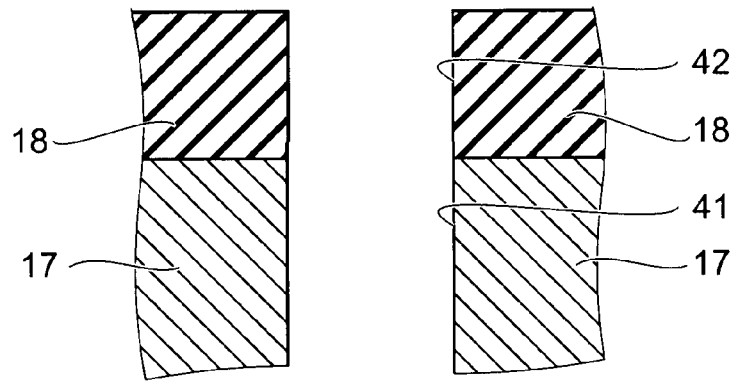
Figure 15C:
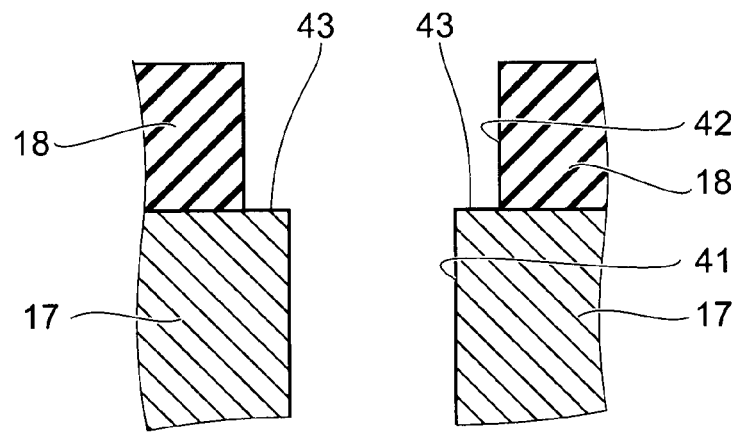

FIGS. 15A to 15C are process sectional views illustrating a method for manufacturing a semiconductor memory device according to this embodiment, and showing the vicinity of the select gate electrode.

First, in the method described in the above first embodiment, the processes shown in FIGS. 4 to 11 are performed.

Next, as shown in FIG. 15A, silicon oxide is deposited to form an insulating film 18 on the electrode film 17. Next, by RIE, a through hole 42 extending in the Z direction is formed in the insulating film 18. Continuously, as shown in FIG. 15B, the insulating film 18 is used as a mask to form a through hole 41 in the electrode film 17. At this stage, the diameter of the through hole 42 is equal to the diameter of the through hole 41. Next, as shown in FIG. 15C, part of the insulating film 18 is dissolved by wet processing using chemicals containing e.g. hydrofluoric acid. Thus, the through hole 42 is expanded and made thicker than the through hole 41. Consequently, a step difference 43 is formed at the boundary between the inner surface of the through hole 41 and the inner surface of the through hole 42.

The subsequent processes are similar to the processes shown in FIG. 13C and the following figures in the above first embodiment. More specifically, a gate insulating film 28 and a silicon film 34 are formed on the inner surface of the through holes 41 and 42, and impurity is ion-implanted into the silicon film 34. Subsequently, the upper structure is formed. Thus, a semiconductor memory device 1 similar to that of the above first embodiment is manufactured. The configuration, manufacturing method, and operation and effect of this embodiment other than the foregoing are similar to those of the above first embodiment. Here, also in this embodiment, the order of the ion implantation processes may be reversed. Furthermore, the step difference 43 may be formed by other methods. Furthermore, the film configuration of the gate insulating film 28 may be the same as the film configuration of the memory film 24.

Next, a third embodiment is described.

Figure 16:
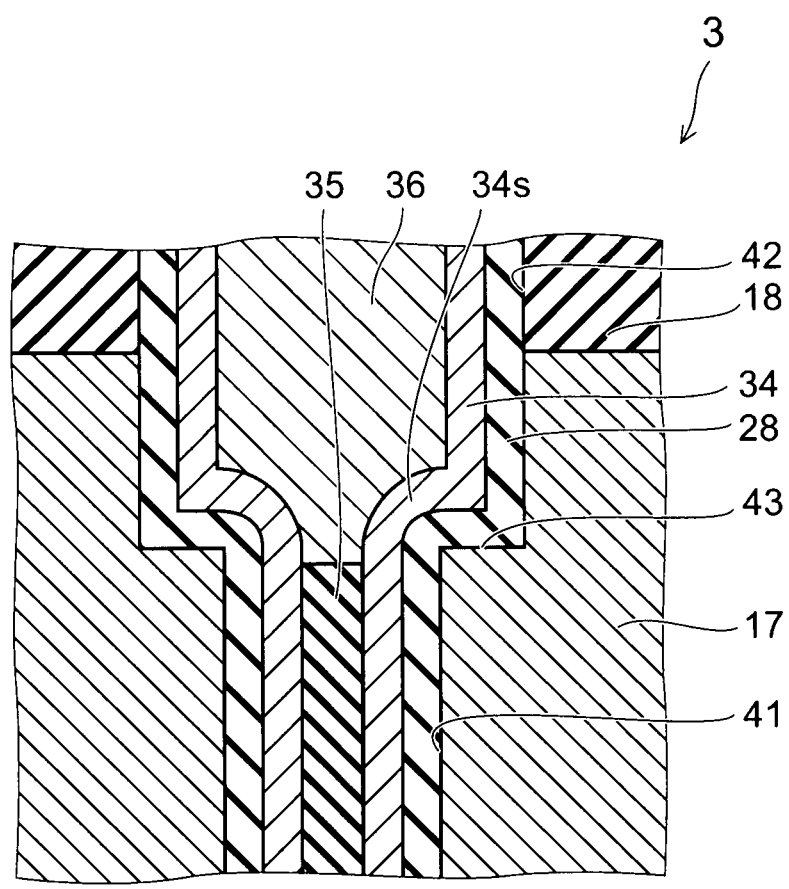
FIG. 16 is a sectional view illustrating the vicinity of the select gate electrode in a semiconductor memory device according to a third embodiment.

FIG. 16 is a sectional view illustrating the vicinity of the select gate electrode in a semiconductor memory device according to this embodiment.

As shown in FIG. 16, in the semiconductor memory device 3 according to this embodiment, the step difference 43 is formed on the inner surface of the through hole 41. Thus, the portion of the through hole 41 above the step difference 43 is thicker than the portion below the step difference 43. Furthermore, the portion 34s of the silicon film 34 covering the step difference 43 has higher impurity concentration than the portion of the silicon film 34 except the portion 34s. The configuration of this embodiment other than the foregoing is similar to that of the above first embodiment.

Next, a method for manufacturing a semiconductor memory device according to this embodiment is described.

FIGS. 17A to 17C and 18A to 18C are process sectional views illustrating a method for manufacturing a semiconductor memory device according to this embodiment, and showing the vicinity of the select gate electrode.

First, in the method described in the above first embodiment, the processes shown in FIGS. 4 to 11 are performed.

Figure 17A:
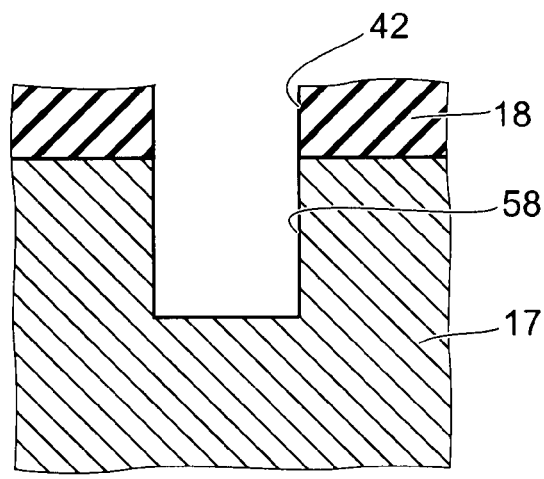
FIGS. 17A to 18C are process sectional views illustrating a method for manufacturing the semiconductor memory device according to the third embodiment, and showing the vicinity of the select gate electrode.

Next, as shown in FIG. 17A, silicon oxide is deposited to form an insulating film 18 on the electrode film 17. Next, by RIE, a through hole 42 extending in the Z direction is formed in the insulating film 18. Continuously, the insulating film 18 is used as a mask to perform etching to form a recess 58 in the electrode film 17. Here, the recess 58 is not caused to penetrate through the electrode film 17. Furthermore, at this stage, the diameter of the through hole 42 is equal to the diameter of the recess 58.

Figure 17B:
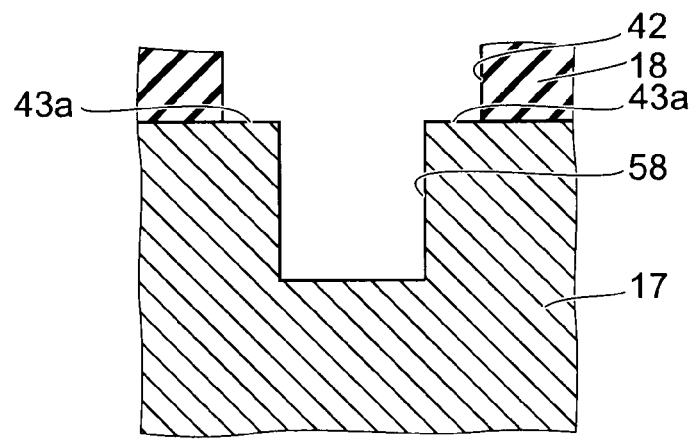

Next, as shown in FIG. 17B, part of the insulating film 18 is dissolved by wet processing using chemicals containing e.g. hydrofluoric acid. Thus, the through hole 42 is expanded. At this time, the electrode film 17 is not substantially dissolved. Hence, the diameter of the recess 58 is not changed. Thus, the through hole 42 is made thicker than the recess 58, and a step difference 43a is formed at the boundary between the inner surface of the through hole 42 and the side surface of the recess 58.

Figure 17C:
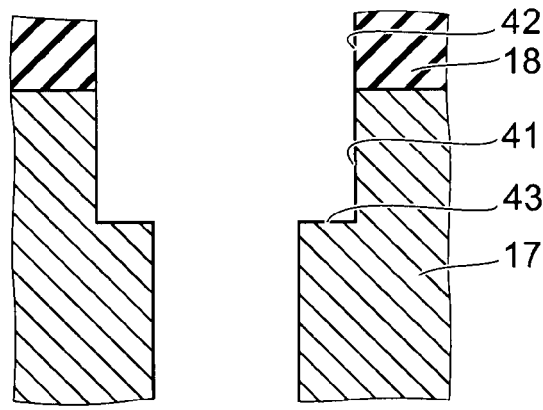

Next, as shown in FIG. 17C, anisotropic etching such as RIE is performed under the condition that the etching rate for silicon is higher than the etching rate for silicon oxide. Hence, the electrode film 17 is etched downward with the insulating film 18 used as a mask. Thus, the recess 58 is deepened, and the step difference 43a is moved downward. Then, the recess 58 is caused to penetrate through the electrode film 17 to form a through hole 41. At this time, the step difference 43a is located on the inner surface of the through hole 41 and constitutes a step difference 43.

Figure 18A:
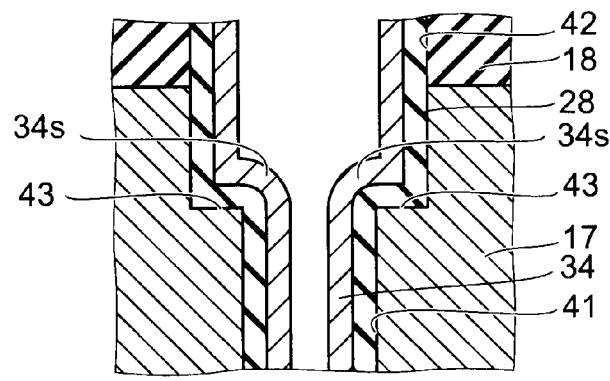
Figure 18B:
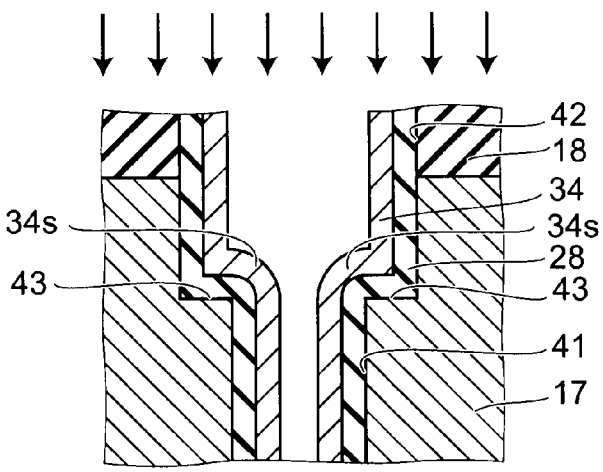
Figure 18C:
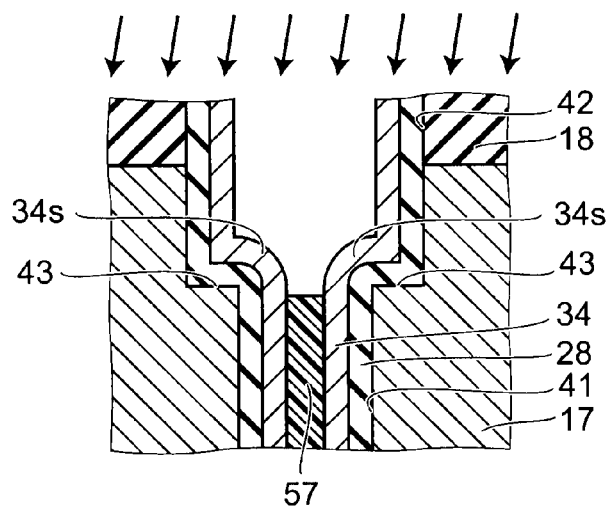

The subsequent processes are similar to those in the above first embodiment. More specifically, as shown in FIG. 18A, a gate insulating film 28 and a silicon film 34 are formed on the inner surface of the through holes 41 and 42. As shown in FIG. 18B, impurity is ion-implanted into the silicon film 34 in the vertical direction (Z direction). Next, as shown in FIG. 18C, a resist material 57 is buried in the portion of the through hole 41 below the step difference 43, and impurity is ion-implanted into the silicon film 34 in the direction inclined from the Z direction. The condition for these ion implantations is similar to that of the above first embodiment. Subsequently, the upper structure is formed. Thus, the semiconductor memory device 3 according to this embodiment is manufactured. The manufacturing method of this embodiment other than the foregoing is similar to that of the above first embodiment.

According to this embodiment, the step difference 43 is formed on the inner surface of the through hole 41. Hence, the portion 34s of the silicon film 34 having high impurity concentration is located inside the through hole 41, i.e., in the portion surrounded by the select gate electrode SG. Thus, the select gate electrode SG can be caused to effectively overlap the portion 34s having high impurity concentration so that high GIDL can be achieved. Furthermore, even if the concentration distribution of impurity is shifted in the Z direction, the overlapping length of the select gate electrode SG and the portion 34s does not change. Hence, the magnitude of GIDL can be made stable. The operation and effect of this embodiment other than the foregoing are similar to those of the above first embodiment.

Also in this embodiment, the process of performing ion implantation in the vertical direction shown in FIG. 18B and the process of burying the resist material 57 and performing ion implantation in the oblique direction shown in FIG. 18C may be performed in the reverse order. Furthermore, the step difference 43 may be formed by other methods. Furthermore, the film configuration of the gate insulating film 28 may be the same as the film configuration of the memory film 24.

The embodiments described above can realize a semiconductor memory device with low power consumption and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

For instance, the film configuration of the gate insulating film 28 may be the same as the film configuration of the memory film 24, and the gate insulating film 28 and the memory film 24 may be formed in the same process.

The invention claimed is:

1. A semiconductor memory device comprising:
   a multilayer body with a plurality of first insulating films and first electrode films alternately stacked, the multilayer body including a first through hole extending in stacking direction of the first insulating films and the first electrode films;
   a second electrode film provided on the multilayer body and including a second through hole, the second through hole extending in the stacking direction and being coupled with the first through hole;
   a second insulating film provided on the second electrode film and including a third through hole, the third through hole extending in the stacking direction and being coupled with the second through hole;
   a semiconductor film provided on inner surfaces of the first to third through hole;
   a memory film provided between the first electrode films and the semiconductor film; and
   a gate insulating film provided between the second electrode film and the semiconductor film,
   at boundary between the inner surface of the second through hole and the inner surface of the third through hole, a step difference being formed so that the third through hole is thicker than the second through hole in a lateral direction perpendicular to the stacking direction.

2. The device according to claim 1, wherein impurity concentration in a portion of the semiconductor film covering the step difference is higher than impurity concentration in a portion except the portion of the semiconductor film covering the step difference.

3. The device according to claim 1, wherein lamination of layers of the memory film is identical to lamination of layers of the gate insulating film.

4. A semiconductor memory device comprising:
   a multilayer body with a plurality of first insulating films and first electrode films alternately stacked, the multilayer body including a first through hole extending in stacking direction of the first insulating films and the first electrode films;

a second electrode film provided on the multilayer body and including a second through hole, the second through hole extending in the stacking direction and being coupled with the first through hole;

a second insulating film provided on the second electrode film and including a third through hole, the third through hole extending in the stacking direction and being coupled with the second through hole;

a semiconductor film provided on inner surfaces of the first to third through hole;

a memory film provided between the first electrode films and the semiconductor film; and a gate insulating film provided between the second electrode film and the semiconductor film, on the inner surface of the second through hole, a step difference being formed so that an upper side of the second through hole is thicker than a lower side of the second through hole in a lateral direction perpendicular to the stacking direction.

5. The device according to claim 4, wherein impurity concentration in a portion of the semiconductor film covering the step difference is higher than impurity concentration in a portion except the portion of the semiconductor film covering the step difference.

6. The device according to claim 4, wherein lamination of layers of the memory film is identical to film configuration lamination of layers of the gate insulating film.

* * * * *